US006809551B1

(12) United States Patent
Wicker, Jr.

(10) Patent No.: US 6,809,551 B1
(45) Date of Patent: Oct. 26, 2004

(54) METHOD OF OPTIMIZING ROUTING IN A PROGRAMMABLE LOGIC DEVICE

(75) Inventor: David J. Wicker, Jr., Hillsboro, OR (US)

(73) Assignee: Lattice Semiconductor Corporation, Hillsboro, OR (US)

(*) Notice: Subject to any disclaimer, the term of this patent is extended or adjusted under 35 U.S.C. 154(b) by 0 days.

(21) Appl. No.: 10/255,875

(22) Filed: Sep. 25, 2002

Related U.S. Application Data

(63) Continuation-in-part of application No. 10/187,236, filed on Jun. 28, 2002.

(51) Int. Cl.$^7$ .............................................. H03K 19/177
(52) U.S. Cl. .............................. 326/41; 326/38; 326/47
(58) Field of Search .............................. 376/37–41, 47

(56) References Cited

U.S. PATENT DOCUMENTS

| | | | |
|---|---|---|---|
| 4,642,487 A | 2/1987 | Carter | |
| 4,706,216 A | 11/1987 | Carter | |
| 4,758,985 A | 7/1988 | Carter | |
| 5,197,065 A | 3/1993 | Calvignac et al. | |
| 5,295,137 A | 3/1994 | Jurkevich | |
| 5,754,459 A | 5/1998 | Telikepalli | |
| 6,023,742 A * | 2/2000 | Ebeling et al. | 710/107 |
| 6,262,908 B1 * | 7/2001 | Marshall et al. | 365/63 |
| 6,275,491 B1 | 8/2001 | Prasad et al. | |
| 6,289,097 B1 | 9/2001 | Gregory et al. | |
| 6,362,650 B1 | 3/2002 | New et al. | |
| 6,363,319 B1 | 3/2002 | Hsu | |
| 6,538,470 B1 | 3/2003 | Langhammer et al. | |
| 2002/0089348 A1 | 7/2002 | Langhammer | |

OTHER PUBLICATIONS

Alves et al., "RVC—A Reconfigurable Coprocessor for Vector Processing Applications," IEEE Com. Soc., pp. 258–259 (1998).
Birkner et al., "High Performance Mulitpliers in QuickLogic FPGAs," 9 pp, no date.
Chameleon Systems—Your Communication Platform; from website www.chameleonsystems.com, 5 pp., no date.
Goering, "Tool Suite Supports Reconfigurable Processor," *EE Times*, 6pp. (Aug. 14, 2001).
Olay III, "Re-configurable High Speed Arithmetic Functions in a Non-Volatile FPGA," 6 pp, no date.
QuickLogic Home; Eclipse, High Performance FPGAs with Enhanced Logic Supercell; from website www.quicklogic.com, 3 pp., no date.
QuickLogic Home; QuickDSP, Embedded DSP Building Blocks for High-Performance, Complex DSP Designs; from website www.quicklogic.com, 2 pp, no date.

(List continued on next page.)

*Primary Examiner*—Anh Q. Tran

(57) ABSTRACT

A method of routing input signals in a programmable logic device (PLD) is disclosed. In a PLD having a PLD domain and a vector domain, input signals from the PLD domain are typically routed to the vector domain through an interface. The interface, however, often comprises a limited number of conductors and restricts the amount of data that can be directly transmitted to the vector domain. The disclosed method may be utilized to design an input switching unit that may use PLD-domain resources to route the input signals according to the time periods (or states) in which they operate. The input switching unit may comprise one or more multiplexers that are used to route the input signals in a time-multiplexed manner. As a result of the disclosed method, the amount of data that can be transmitted through the interface is maximized.

29 Claims, 20 Drawing Sheets

OTHER PUBLICATIONS

QuickLogic Home; QuickRAM, Dual–Port Embedded RAM for Extremely High Performance Functions; from website www.quicklogic.com, 3 pp, no date.

"Silicon," Xilinx Products website, http://www.xilinx.com/xlnx/xil_product_product.jsp?title+silicon, printed Sep. 16, 2002, 3 pp.

"Stratix: Programmable Logic Device Family," Altera Corporation, V. 2.1, Data Sheet (Aug. 2002).

Xilinx Home; PowerPC Embedded Processor Solution; from website www.xilinx.com, 2 pp, no date.

Xilinx Home; The First Platform FPGA Solution; from website www.xilinx.com, 2 pp., no date.

Xilinx Home; Virtex–II Platform FPGA Features; from website www.xilinx.com, 3 pp, no date.

Xilinx Home; Virtex–II Pro Platform FPGAs; The Platform for Programmable Systems; from website www.xilinx.com, 3 pp, no date.

* cited by examiner

FIG. 14

| | ENGINE INPUTS | | | | | | | | | | | | | |
|---|---|---|---|---|---|---|---|---|---|---|---|---|---|---|
| | Inputs to Engine by State | | | | | | | | | | | | | |
| Engine Input | 0 | 1 | 2 | 3 | 4 | 5 | 6 | 7 | 8 | 9 | 10 | 11 | 12 | 13 |
| A | | a | a | | | | | | | | | | | |
| B | | b | b | | | | | | | | | | | |
| C | | c | c | e | e | | | | | | | | | |
| H | | | | | | | | | d | | | | | |
| D | | | | f | | | | | f | | h | | | |
| E | | | | g | | | | | g | | i | | | |
| F | | | | f | | | | | | | | | | |
| G | | | | g | | | | | | | | | | |

INITIAL GROUPED SIGNALS

| Inputs | Value |
|---|---|
| f, h | 1288 |
| g, i | 1288 |
| c, e | 30 |
| a | 6 |
| b | 6 |
| d | 256 |

FIRST ITERATION

| Input Signals | Value |
|---|---|
| Signals under consideration | |
| f, h | 1288 |
| | |
| Sorted signals | |
| g, i | 1288 |
| c, e | 30 |
| d | 256 |
| a | 6 |
| b | 6 |
| | |
| Result | |
| a | |

SECOND ITERATION — 220

| Input Signals | Value |
|---|---|
| Signals under consideration | |
| f, h, a | 1294 |
| | |
| Sorted signals | |
| g, i | 1288 |
| c, e | 30 |
| d | 256 |
| b | 6 |
| | |
| Result | |
| NONE | |

222 → f, h, a
226 → NONE

FIG. 20

THIRD ITERATION — 230

| Input Signals | Value |
|---|---|
| Signals under consideration | |
| g, i | 1288 |
| | |
| Sorted signals | |
| c, e | 1288 |
| d | 256 |
| b | 6 |
| | |
| Result | |
| b | |

FOURTH ITERATION — 240

| Input Signals | Value |
|---|---|
| Signals under consideration | |
| g, i, b | 1294 |
| | |
| Sorted signals | |
| c, e | 30 |
| d | 256 |
| | |
| Result | |
| NONE | |

242 → (Signals under consideration row)
246 → (NONE)

FIG. 22

FIFTH ITERATION — 250

| Input Signals | Value |
|---|---|
| Signals under consideration | |
| c, e | 30 |
| | |
| Sorted signals | |
| d | 6 |
| | |
| Result | |
| d | |

252 → (c, e row)
256 → (d Result row)

METHOD OF OPTIMIZING ROUTING IN A PROGRAMMABLE LOGIC DEVICE

RELATED APPLICATION DATA

This application is a continuation-in-part of application No. 10/187,236, filed Jun. 28, 2002.

TECHNICAL FIELD

The present invention relates to programmable logic devices (PLDs), such as field-programmable gate arrays (FPGAs) and complex PLDs (CPLDs). More particularly, the present invention relates to a method of routing signals in a PLD.

BACKGROUND

Non-volatile memory devices, such as EPROM, EEPROM, and Flash EEPROM, store data even after power is turned off. One common application of EEPROMs is in programmable logic devices (PLDs). PLDs are standard semiconductor components purchased by systems manufacturers in a "blank" state that can be custom configured into a virtually unlimited number of specific logic functions. PLDs provide system designers with the ability to quickly create custom logic functions to provide product differentiation without sacrificing rapid time to market. PLDs may be reprogrammable, meaning that the logic configuration can be modified after the initial programming.

One type of PLD is known as a Field-Programmable Gate Array (FPGA). An FPGA is a general purpose device that can be programmed by an end user to perform one or more selected functions. An FPGA typically includes an array of individually programmable logic cells (PLCs), each of which is programmably interconnected to other PLCs and to input/output (I/O) pins via a programmable routing structure to provide the selected function. Examples of such devices are exemplified in U.S. Pat. Nos. 4,642,487; 4,706,216; and 4,758,985.

An FPGA device can be characterized as an integrated circuit that may include four major features:

(1) A user-accessible, configurable memory device, such as SRAM, EPROM, EEPROM, anti-fused, fused, or other, is provided in the FPGA device so as to be at least once-programmable by device users for defining user-provided configuration information. Static Random Access Memory or SRAM is a form of reprogrammable memory that may be differently programmed many times. Electrically Erasable programmable ROM or EEPROM is another example of nonvolatile reprogrammable memory. The configurable memory of an FPGA device may be formed of a mixture of different kinds of memory elements if desired (e.g., SRAM and EEPROM).

(2) Input/Output Blocks (IOBs) are provided for interconnecting other internal circuit components of the FPGA device with external circuitry. The IOBs may have fixed configurations or they may be configurable in accordance with user-provided configuration information.

(3) PLCs are provided for carrying out user-programmed logic functions (e.g., logic gates) as defined by user-provided configuration information. Typically, each of the many PLCs of an FPGA has at least one lookup table (LUT) that is user-configurable to define any desired truth table. A PLC may have other resources such as LUT input signal pre-processing resources and LUT output signal post-processing resources.

(4) An interconnect network is provided for carrying signal traffic within the FPGA device between various PLCs and/or between various IOBs and/or between various IOBs and PLCs. At least part of the interconnect network is typically configurable so as to allow for programmably-defined routing of signals between various PLCs and/or IOBs in accordance with user-defined routing information.

Most FPGAs have these four features, but modern FPGAs tend to be even more complex. For example, many PLCs can be configured together to implement such devices as multipliers or complex microprocessors. For example, U.S. Pat. No. 5,754,459, issued May 19, 1998 to Telikepalli, teaches implementing a multiplier circuit using a number of PLCs in an FPGA architecture. However, implementing a multiplier using PLCs of an FPGA architecture may not only consume valuable PLC resources, but also consume valuable general interconnect resources, which in turn may slow performance of the FPGA device. Consequently, preconfigured, dedicated multipliers have been inserted into some FPGA designs in order to free valuable PLC resources for other functions, such as illustrated in U.S. Pat. No. 6,362,650 to New, et al.

It is therefore desirable to provide a PLD device that can further free valuable PLC resources while increasing overall functionality. Including other dedicated components into the PLD, however, can create routing problems between the PLCs and the dedicated components. Accordingly, it is desirable to provide a method of optimizing routing in a PLD.

SUMMARY

A method of routing input signals in a programmable logic device (PLD) is disclosed. In a PLD having a PLD domain (where data is manipulated on a bit-by-bit basis) and a vector domain (where bits are grouped together and manipulated as multi-bit data units termed words or vectors), input signals from the PLD domain may be routed to the vector domain through an interface. The interface, however, often comprises a limited number of conductors and restricts the amount of data that can be directly transmitted to the vector domain. To overcome this problem, an input switching unit is disclosed that may use PLD-domain resources to route the input signals according to the time periods (or states) in which they operate. The input switching unit may comprise one or more multiplexers that route the input signals in a time-multiplexed manner. Thus, the amount of data that can be transmitted through the interface is maximized.

According to one aspect of the disclosed method, input signals are associated with time periods, and at least a portion of the input signals are grouped into groups of input signals that share a conductor but that use the conductor during mutually exclusive time periods. In one particular implementation of the method, the grouping is accomplished through the creation of one or more data structures. For example, a first data structure may identify the time periods in which the input signals are used. The first data structure may further identify the vector-domain destinations to which the input signals are routed (e.g., inputs of a vector-domain engine). A second data structure may identify usage values for the input signals. The usage values of the input signals may then be used to identify the time periods in which the input signals operate. A third data structure may identify related input signals. Related input signals comprise input signals that are routed to a common vector-domain destination. A fourth data structure may contain data entries identifying the related input signals and the remaining unrelated input signals. The entries of the fourth data structure may further identify combined usage values for the related input signals and usage values for the remaining unrelated input signals. The fourth data structure may then be iteratively compressed by grouping together data entries that identify input signals used during mutually exclusive time periods. A final data structure may then be generated from the compressed fourth data structure.

A PLD having an input switching unit for routing input signals that operate in mutually exclusive time periods is also disclosed. The input switching unit may be designed using the disclosed method.

These and other aspects of the disclosed technology will become apparent from the following detailed description, which makes references to the accompanying drawings.

BRIEF DESCRIPTION OF THE DRAWINGS

FIG. 14 shows an exemplary alternative first data structure identifying the time periods in which the input signals operate.

FIG. 17 shows an exemplary fourth data structure identifying the related inputs signals, the remaining unrelated input signals, and their associated usage values.

FIG. 18 shows an exemplary data structure showing the results of a first iteration compressing the fourth data structure.

FIG. 19 shows an exemplary data structure showing the results of a second iteration compressing the fourth data structure.

FIG. 20 shows an exemplary data structure showing the results of a third iteration compressing the fourth data structure.

FIG. 21 shows an exemplary data structure showing the results of a fourth iteration compressing the fourth data structure.

FIG. 22 shows an exemplary data structure showing the results of a fifth iteration compressing the fourth data structure.

DETAILED DESCRIPTION

Figure 1:
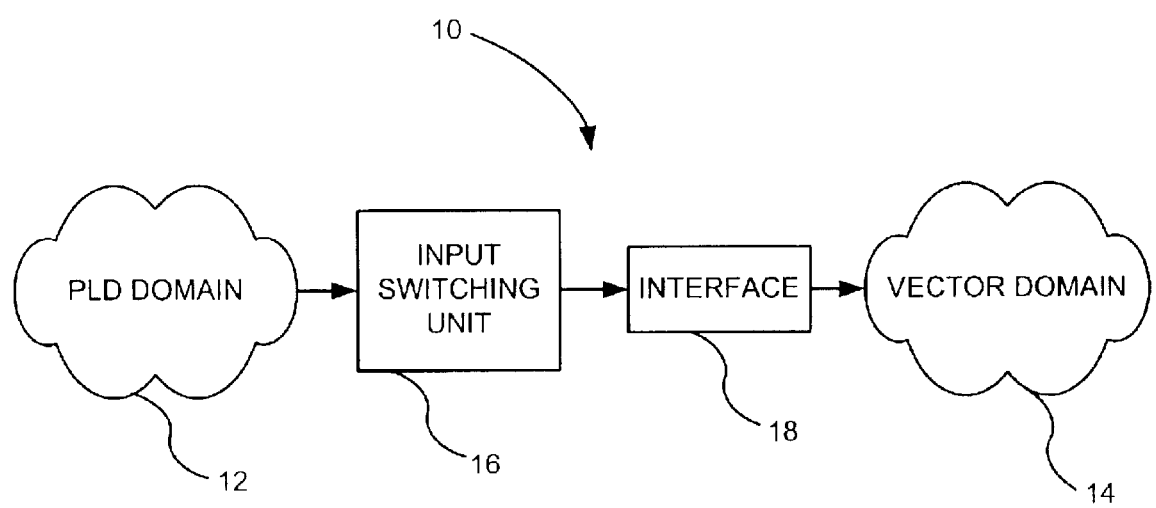
FIG. 1 is a high-level diagram of a programmable logic device (PLD) that includes an input switching unit used to optimize the transfer of input signals from a PLD domain to a vector domain.

FIG. 1 is a high-level diagram of a programmable logic device (PLD) 10, including a PLD domain 12, a vector domain 14, an input switching unit 16, and an interface 18. Input switching unit 16 is coupled to PLD domain 12 and, as further described below, groups together input signals from the PLD domain. Input switching unit 16 is coupled to interface 18, which converts the inputs from the PLD domain into vectors used in the vector domain 14. Input switching unit 16 may be constructed of PLD-domain resources or may comprise a separate physical interface. PLD domain 12 may include conventional fine-grain logic, memory, and routing resources where signals are switched and routed on a bit-by-bit basis. Such bit-by-bit manipulation is termed unordered because the bits are not arranged in a predetermined order throughout the domain. Vector domain 14 may include one or more columns of vector-domain components (not shown) that perform dedicated operations on digital vectors. Digital vectors, or words, comprise multiple bits grouped together in a predetermined order throughout the domain (e.g., 16-, 32-, 64-bit vectors, etc.). In the vector domain 14, groups of wires are routed together as a vector signal path so that all bits in a digital word are manipulated as a vector. That is, the bits in a vector are controlled and switched at once as a group. Interface 18 converts selected unordered bits from the PLD domain 12 to vectors for the vector domain 14. Interface 18 comprises multiple conductors that are used to transfer data from input switching unit 16 to vector domain 14. Typically, the number of signals from PLD domain 12 that are to be routed to vector domain 14 (the input signals) exceeds the number of conductors in interface 18. Thus, the input signals need to be routed through interface 18 during different time periods (or states) in order to enable proper routing and processing of the input signals in vector domain 14. Input switching unit 16, described in detail below, optimizes the flow of data from PLD domain 12 to vector domain 14 by grouping together input signals that share a conductor of interface 18, but that do not operate in the same time period. In other words, input switching unit 16 groups together input signals that operate on common conductors during mutually exclusive time periods.

Figure 2:
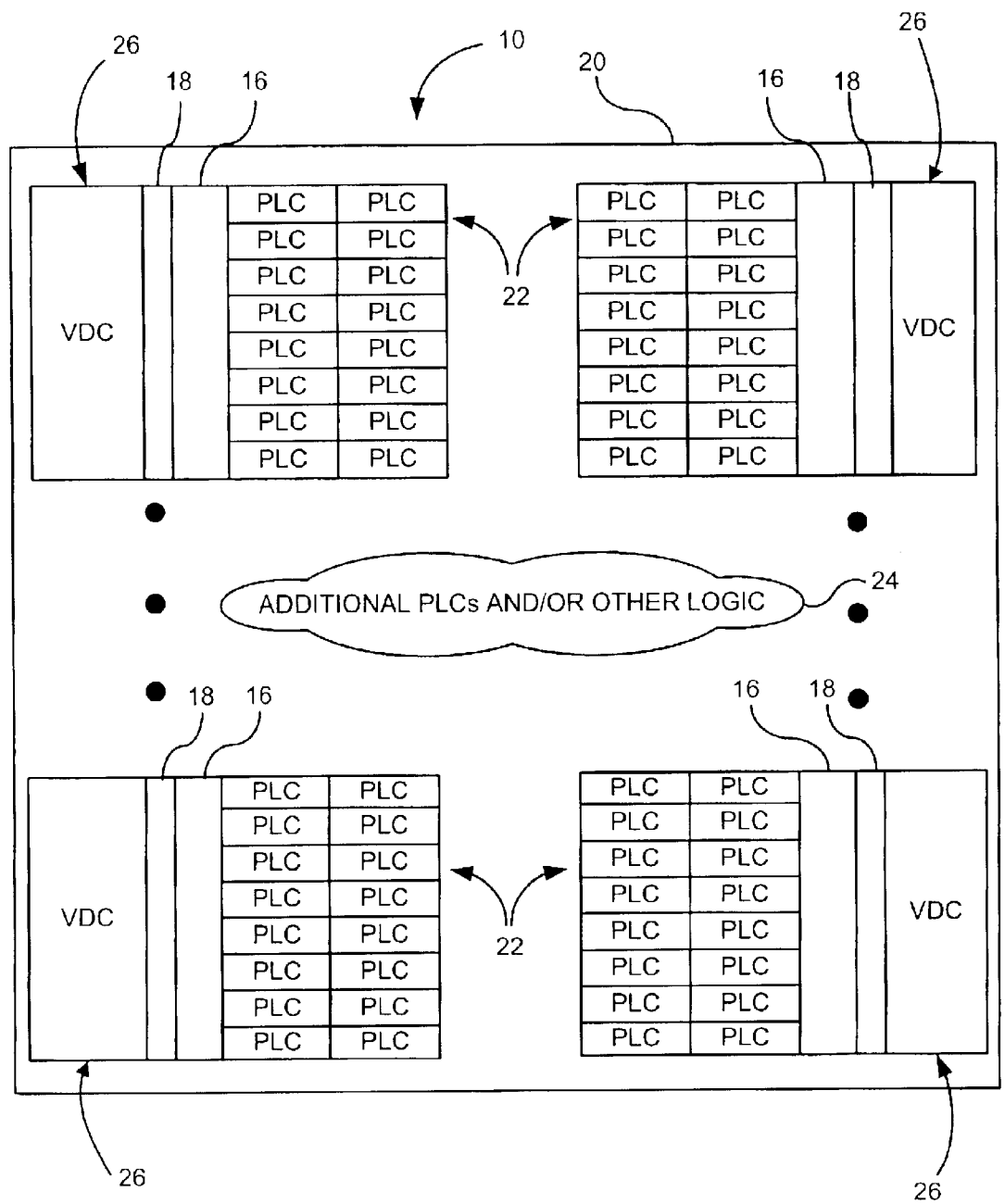
FIG. 2 is a block diagram schematically showing a PLD having multiple vector domain components (VDCs) with multiple input switching units for transferring data between the PLD domain and the vector domain.

FIG. 2 is a block diagram schematically showing PLD 10 in greater detail. PLD 10 is housed in an outer package 20, which includes input and output pins (not shown). PLD 10 has multiple columns of programmable logic cells (PLCs), shown generally at 22. The number of columns of PLCs 22 varies based on the design. As shown at 24, additional PLCs and/or other logic may also exist within PLD 10. For example, other devices (e.g., memories, multipliers, etc.) may be included in logic 24. The illustrated PLD 10 includes one or more vector domain components (VDCs), shown generally at 26, which may comprise various engines or coarse-grain logic blocks configured to operate on digital vectors routed by interface 18. Input switching units 16 and interfaces 18 are used to couple VDCs 26 with PLCs 22.

Figure 3:
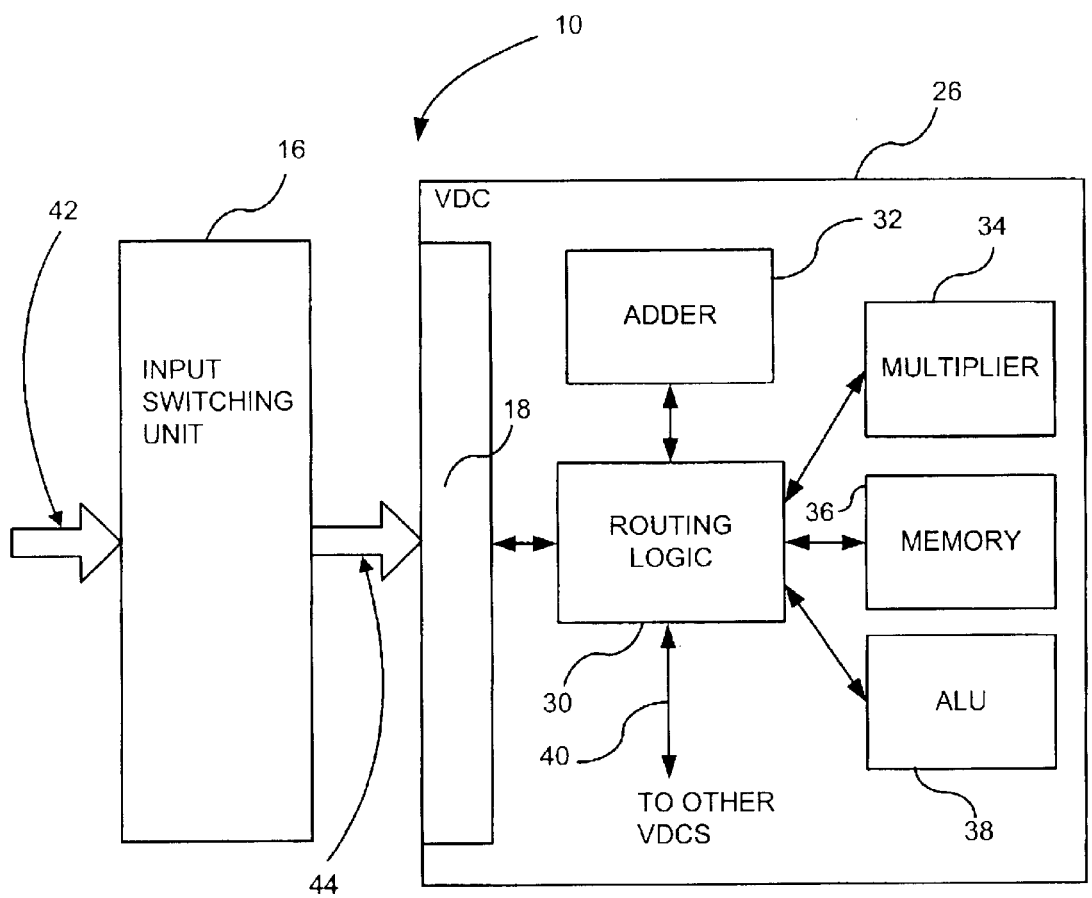
FIG. 3 is a block diagram schematically showing an exemplary input switching unit and a VDC within a PLD.

FIG. 3 is a block diagram schematically showing an exemplary input switching unit 16 and VDC 26 within PLD 10 in greater detail. In the illustrated embodiment, interface 18 is included within VDC 26. In other embodiments, however, interface 18 may be located outside of VDC 26. Routing logic 30 is coupled with interface 18 to facilitate routing to various components (e.g., engines) within VDC 26. For example, VDC 26 may include one or more of the following engines: adders (e.g., adder 32), multipliers (e.g., multiplier 34), memories (e.g., memory 36) and ALUs (e.g., ALU 38). As shown at 40, VDC 26 may be connected via routing logic 30 to engines within other VDCs in PLD 10. Input signals carried on input paths 42 are routed to vector domain 14 from PLD domain 12. In FIG. 3, input paths 42 are first routed to multiple inputs of input switching unit 16. Input switching unit 16 optimizes the passage of the input signals by facilitating the grouping together of the input signals-into output signals carried on outputs paths 44.

The VDC 26 shown in FIG. 3 is preferably not a general-purpose processor. In the illustrated embodiment, it is an application-specific embedded processor that requires a relatively small program store and only communicates with dedicated internal resources. The embedded processor is not built from combinations of programmable logic blocks. Instead, it is made from logic that is designed for a particular type of function (e.g., multiply, add, etc.). By contrast, general processors require large program stores and flexible interfaces to support a wide range of peripheral devices, such as keyboards, disk drives, printers and scanners.

Figure 4:
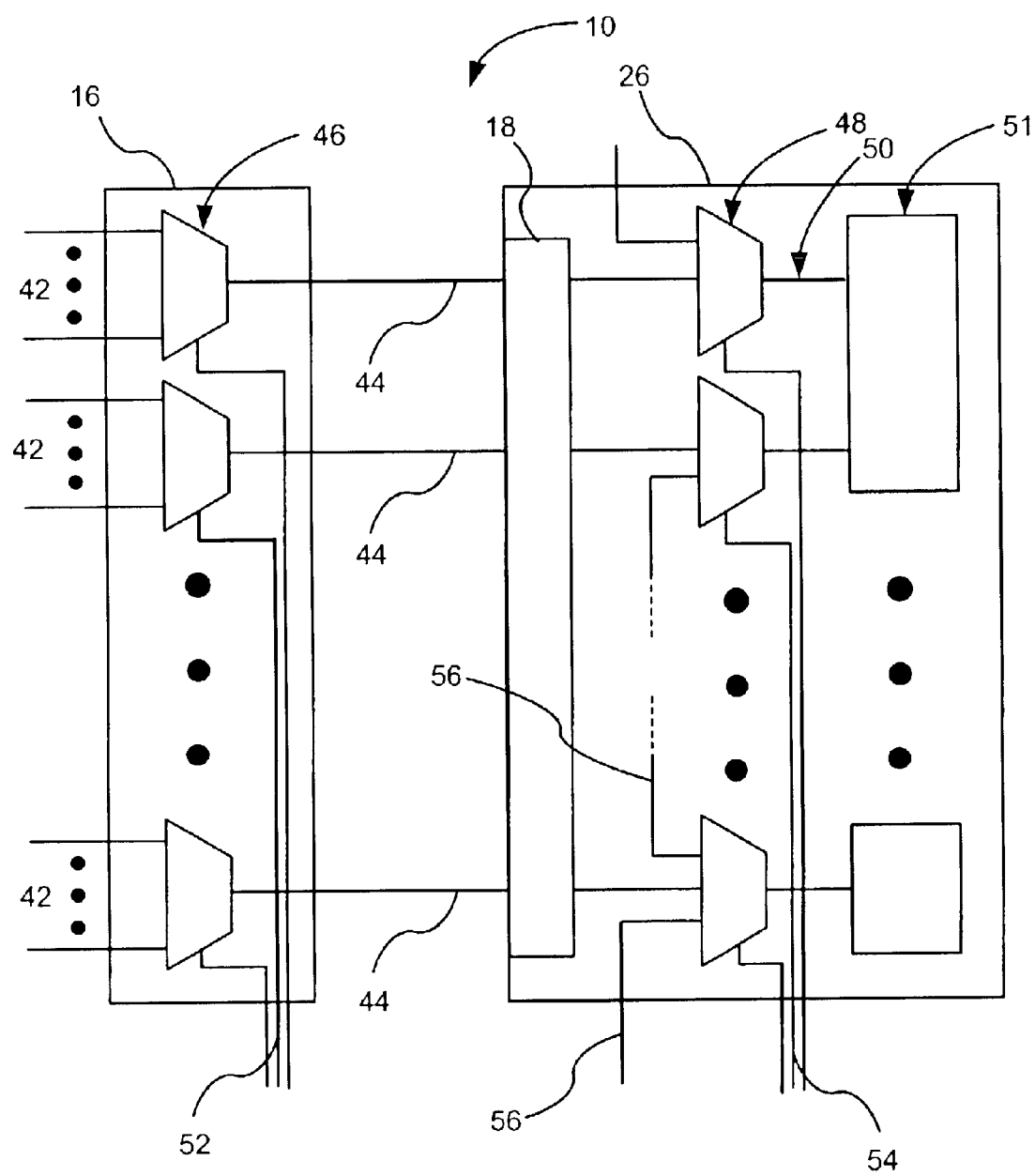
FIG. 4 is a more detailed block diagram schematically showing an exemplary input switching unit within a PLD.

FIG. 4 is a more detailed block diagram schematically showing an exemplary input switching unit 16 and VDC 26 within PLD 10. As noted above, input switching unit 16 may be constructed of PLD resources or may comprise a separate physical interface. Input switching unit 16 contains one or more input multiplexers, shown generally at 46, which serve to group input signals carried on input paths 42 into output signals carried on output paths 44 through time-division multiplexing. Output paths 44 are then routed to VDC 26 through interface 18. Once output paths 44 are routed through interface 18 to VDC 26, the output signals transmitted on the paths are sent to multiple vector-domain multiplexers, shown generally at 48. Vector-domain multiplexers 48 then route the output signals to one or more vector-domain-engine inputs, shown generally at 50. The engine inputs 50 may be routed to one or more vector engines 51. The vector-domain multiplexers 48 may have other input paths, shown generally at 56, from other sources (e.g., from other engines within the VDC or from engines in other VDCs, etc.) As mentioned previously, engines 51 may be adders, multipliers, memories, ALUs, or other logic units. Control line 52 may be used to control which input signals are routed through interface 18 during which periods of time. Thus, control line 52 allows for time-division multiplexing of the input signals through interface 18.

The number of input signals that can be directly transmitted through interface 18 is often less than the total number of input signals to be routed to the vector domain during the overall operation of PLD 10. For instance, interface 18 may be capable of transmitting only two 16-bit vectors from PLD domain 12 to vector domain 14, even though the number of possible input signals may exceed one hundred. The inability of interface 18 to transfer the number of input signals necessary to operate PLD 10 creates a bottleneck for the input signals. Thus, input switching unit 16 groups together input signals that operate in mutually exclusive time periods (i.e., in a time-multiplexed manner) and produces output signals, which can be routed through interface 18 on output paths 44. Accordingly, input switching unit 16 is used to maximize the number of input signals that can be transmitted through the conductors of interface 18.

Figure 24:
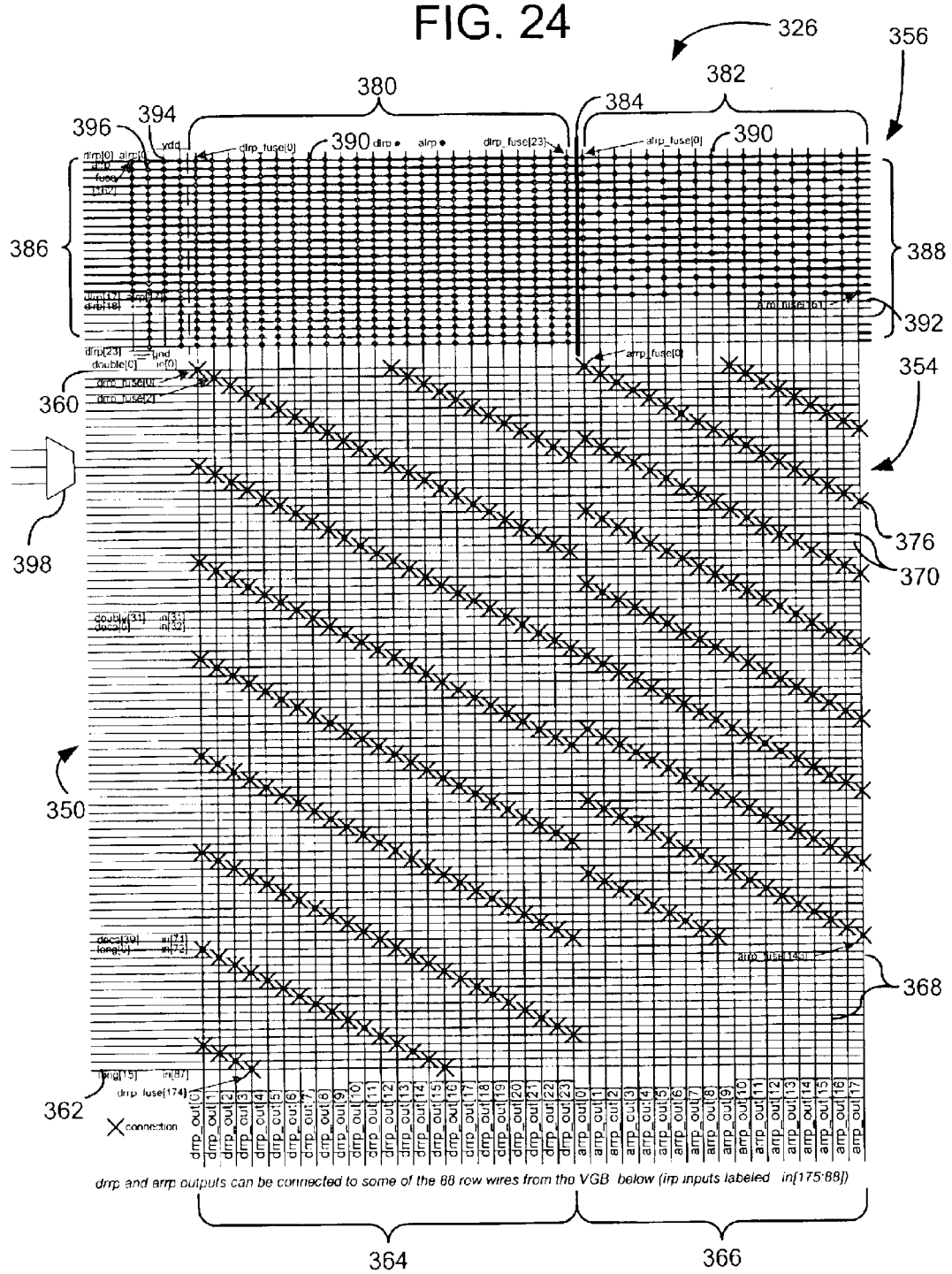
FIG. 24 is a detailed circuit diagram of an interface as shown in FIGS. 1–4.

Turning briefly to FIG. 24, a detailed circuit diagram of an exemplary interface 18 is shown. Interface 18 includes two stages: a first stage, shown generally at 354, and a second stage, shown generally at 356. The input port 350 of the first stage 354 accepts input signals from the PLD domain, including the first bit In[0] shown at 360 and the last input bit ln[87] shown at 362. Although eighty-eight input lines or conductors are shown in this example, any desired number of inputs may be used. An exemplary input switching unit 398 is coupled to one of the input lines. Although not shown, the input port may have a fuse associated with every input line so as to electrically isolate the vector domain from the PLD domain as needed during configuration or normal operation. The first stage 354 also includes a data section 364 and an address section 366. The data section 364 accepts data bits 0–23, which are labeled drrp_out[i]. The address section 366 accepts address bits 0–17, which are labeled arrp_out[i]. Of course, any number of bits may be used for either of the data or address sections. Each bit accepted by the data and address sections 364, 366 is associated with a line or conductor, such as line 368 shown running vertically in FIG. 24 (the lines being electrically in parallel). The vertical lines 368 intersect with horizontal input lines from the input port 350, such as line 370, (which are also electrically parallel) to create an array of interconnection points. A plurality of fuses, such as a fuse shown at 376, are placed at selected intersections between the horizontal and vertical lines 368, 370. The fuses 376 allow configurability so that an electrical connection can be formed at the junction between the vertical and horizontal lines. That is, if a fuse is activated it forms an electrical connection at the junction and if the fuse is not activated it does not form an electrical connection at the junction.

The vertical lines 368 couple the first stage 354 to the second stage 356. The second stage 356 also includes a data section 380 and an address section 382, which are separated by the logical break shown at 384. The data section 380 provides vector outputs shown generally at 386 while the address section 382 provides address vector outputs shown at 388. Both the data and address sections 380, 382 have fuses, such as at 390, for making connections between the vertical lines 368 and horizontal vector lines shown generally at 392. It should be noted that the data section has fuses 390 populated at every intersection between the vector lines 392 and the vertical input lines 368 (fully populated), while the address section 382 is only 50% populated with fuses (partially populated). Of course, any fuse layout scheme may be implemented based on the particular design. However, in order to perform the formatting functions of scaling and sign-extension, it is desirable to have a 100% population of fuses 390 in the second stage in order to optimally minimize routing requirements in the PLD. The fuses 390 are configurable by a user to establish connections between the vector lines 392 and the vertical input lines 368. It should be noted that the logical break 384 creates a physical disconnect of the vector lines 392 between the address and data sections 380, 382. The data section 380 of the second stage 356 includes formatting circuits such as a power line 394 and a ground line 396. Lines 394, 396 allow for establishing power or ground connections (ie., constants) to the vector line 392 based on the programming of fuses at the intersections between the lines 392 and the power and ground lines 394, 396. Thus, as described further below, data scaling and sign extension may be performed with these formatting circuits without using PLD-domain resources. The formatting circuits can, of course, be implemented in other ways in the interface 326. Although not shown, other conductors with fuses may extend into the second stage 356. For example, conductors from another VDC may extend into the second stage and be programmably coupled into the second stage using fuses. Consequently, vectors from other VDCs may be programmably selected and integrated into the vectors of the VDC.

Figure 5:
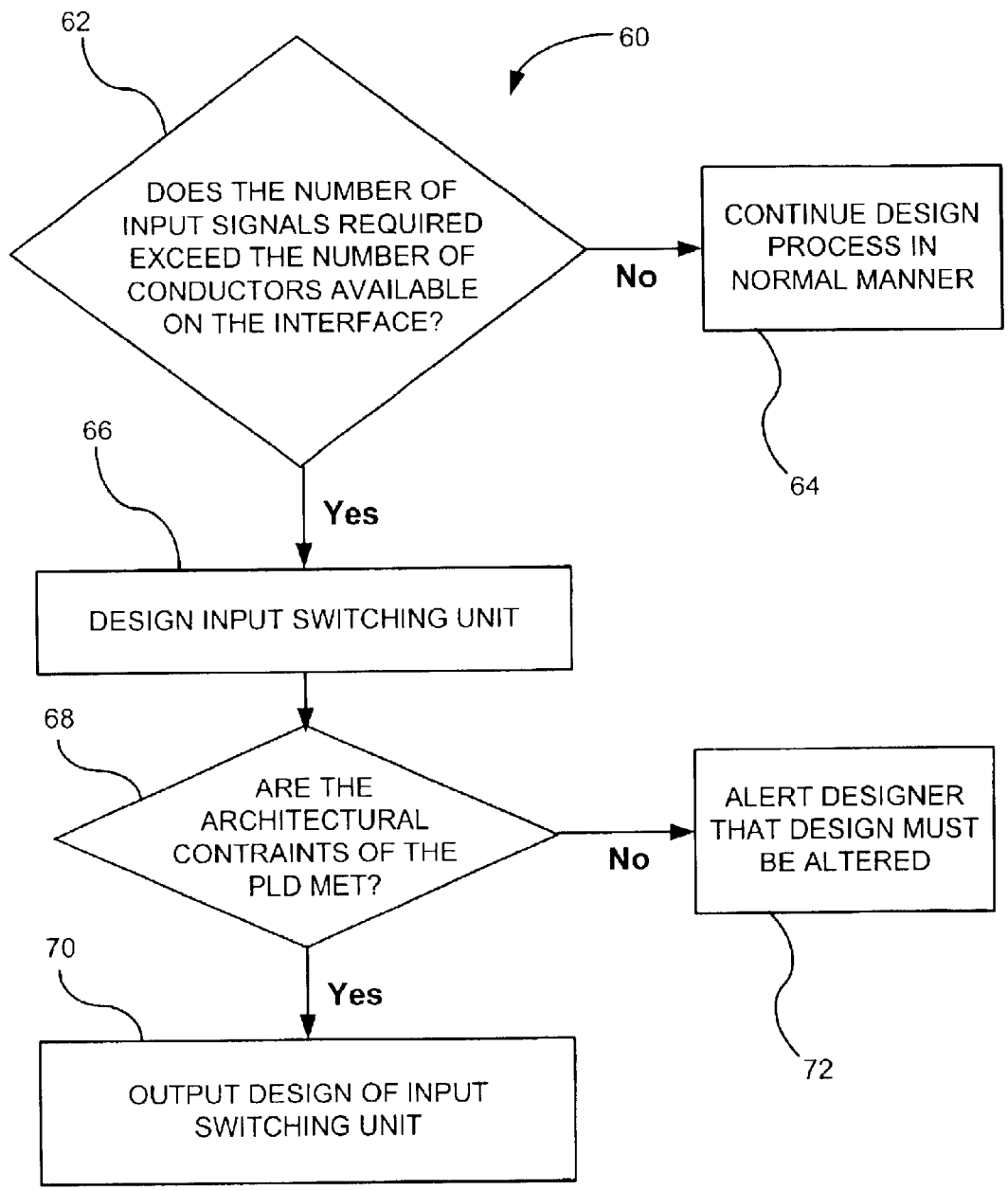
FIG. 5 is a flowchart of a method of designing a PLD having an input switching unit for routing mutually exclusive input signals to the vector domain.

FIG. 5 is a flowchart 60 of a method of designing a PLD having an input switching unit for routing mutually exclusive input signals to the vector domain. In process block 62, a determination is made as to whether the number of input signals required by vector domain 14 exceeds the number of conductors available in interface 18. This determination may be made by analyzing the source code that describes the design of the PLD (e.g., the Verilog source code). If process block 62 is answered in the negative, the design of the PLD continues in a normal manner, as indicated in process block 64. In this case, all of the input signals from the PLD domain 12 can be directly routed to interface 18 and vector domain 14. Thus, the creation of input switching unit 16 is unnecessary. If process block 62 is answered affirmatively, however, method 60 continues with process block 66. In process block 66, input switching unit 16 is designed. This process is described in greater detail below. In one embodiment, once process block 66 is completed, a determination is made at process block 68 as to whether the architectural constraints of PLD 10 are met. Specifically, a determination is made as to whether the resources available in PLD 10 are sufficient to enable the creation of input switching unit 16 as designed. If process block 68 is answered in the affirmative, input switching unit 16 is created in the design of the PLD at process block 70. If process block 68 is answered in the negative, however, the PLD design cannot continue and the designer is alerted that the design must be altered.

Figure 6:
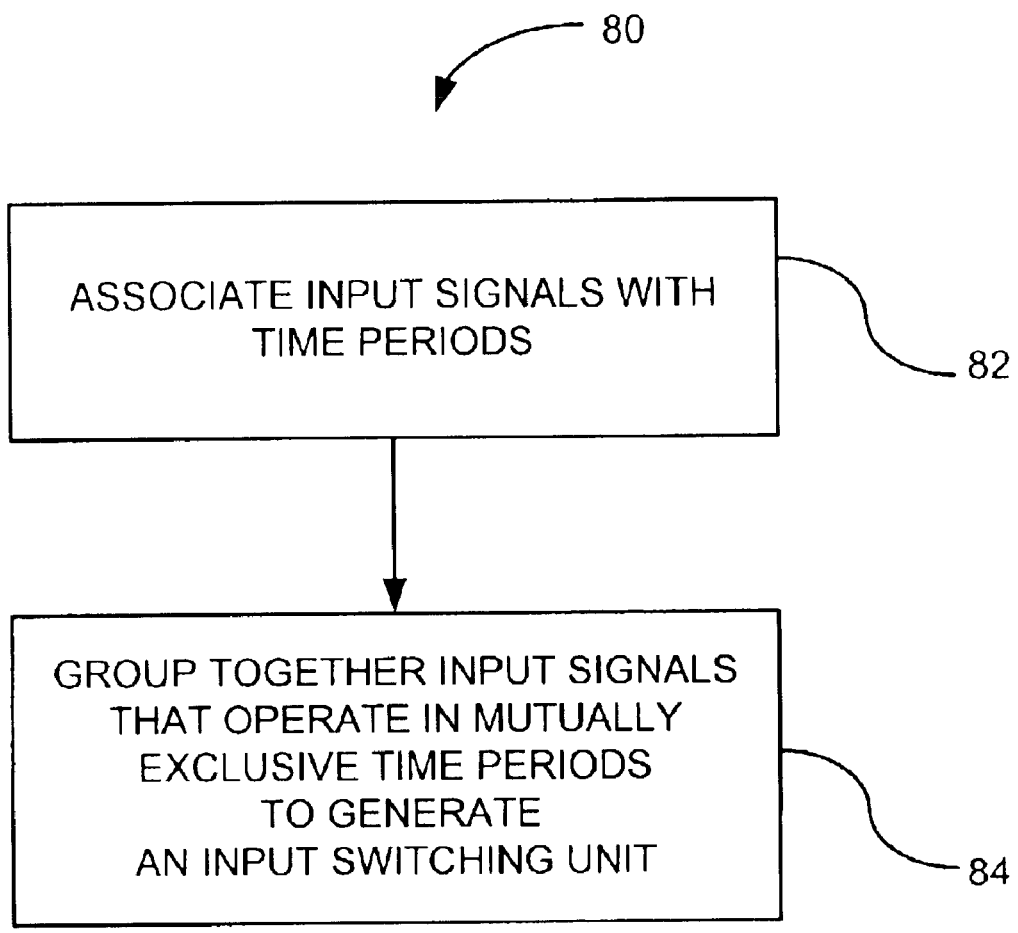
FIG. 6 is a flowchart of the process of designing the input switching unit in FIG. 5.

FIG. 6 is a flowchart 80 showing in greater detail the basic process of designing input switching unit 16 (process block 66 of FIG. 5). Typically, the input signals from PLD domain 12 are not all processed in vector domain 14 at the same time. Instead, the input signals are processed in two or more discrete time periods. The current time period in which the PLD is operating may be controlled by a state machine located in PLD domain 12. In process block 82, input signals that are processed in vector domain 14 from PLD domain 12 are associated with the time periods in which the input signals operate. In process block 84, the information from process block 82 is used to group input signals together that operate in mutually exclusive time periods. For instance, a group may be formed that includes two or more input signals that share a conductor but that use the conductor during different periods of time. Input switching unit 16 may then be designed to multiplex the group and route it along the same conductor of interface 18, thereby maximizing the number of input signals that can pass through the conductor. Input switching unit 16 may be controlled by a control signal that determines which input signals are transmitted through interface 18 during which time periods.

Figure 7:
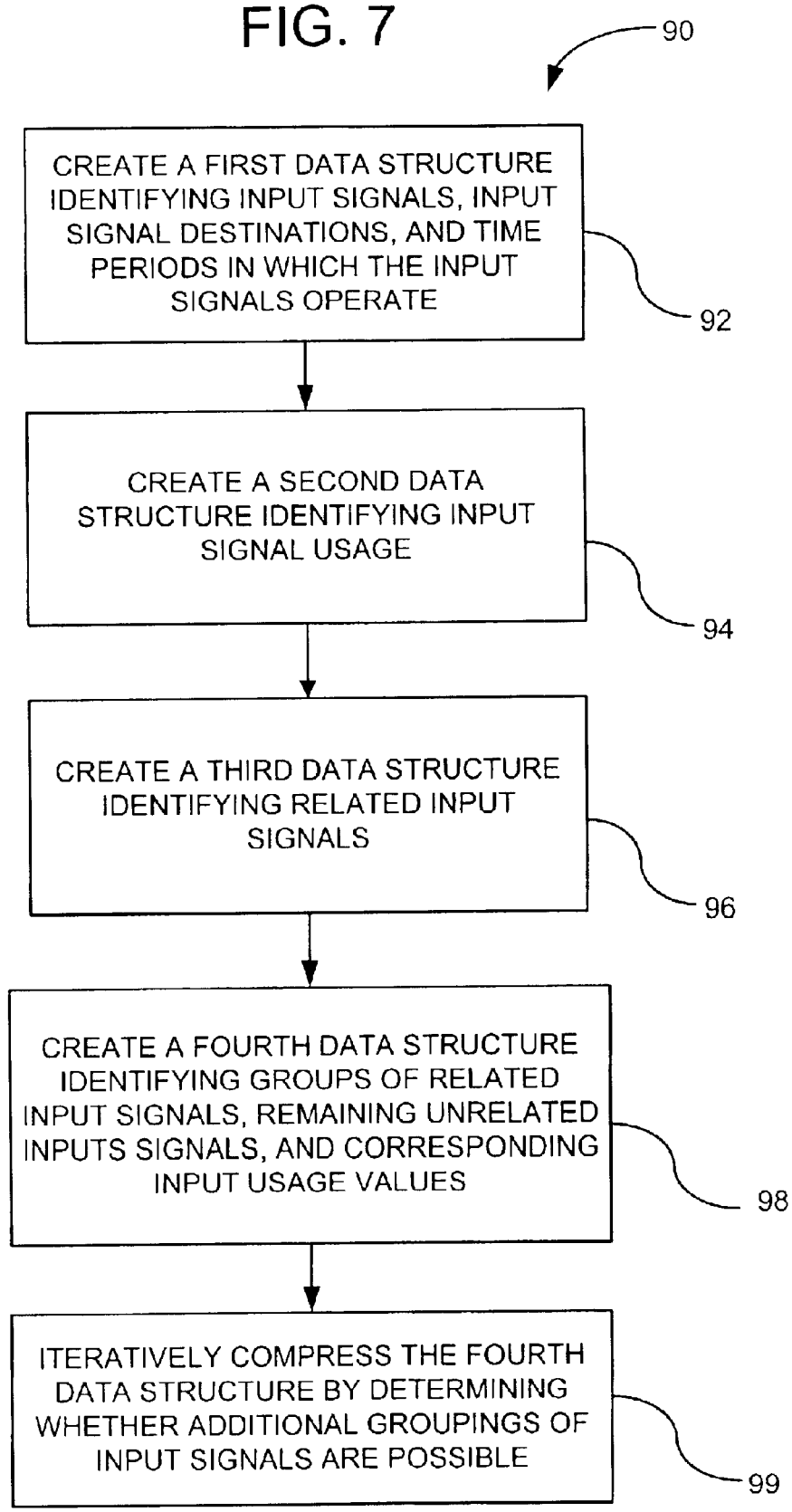
FIG. 7 is a flowchart showing one specific implementation of the process described in FIG. 6 that involves the generation of multiple data structures.

FIG. 7 is a flowchart 90 showing a particular implementation of the basic process shown in FIG. 6. In process block 92, a first data structure is created that identifies input signals, input signal destinations, and the time periods in which the input signals operate. Creation of the first data structure is discussed in detail below in relation to FIG. 8. In process block 94, a second data structure is created that identifies the usage value for each input signal identified in process block 92. Creation of the second data structure is discussed in detail below in relation to FIG. 9. In process block 96, a third data structure is created that identifies which, if any, of the input signals are related to each other. Input signals are designated as being related to each other if they are routed to the same destination. This common destination may be, for instance, a common input of a vector-domain engine. Creation of the third data structure is discussed in detail below in relation to FIG. 10. In process block 98, a fourth data structure is created that combines information from the second and third data structures and identifies an initial set of input signal groupings that may be used to generate input switching unit 16. Creation of the fourth data structure is discussed in detail below in relation to FIG. 11. In process block 99, an iterative process is performed on the fourth data structure to determine whether additional groupings of the input signals are possible. The iteration process is discussed in detail below in relation to FIG. 12.

Figure 8:
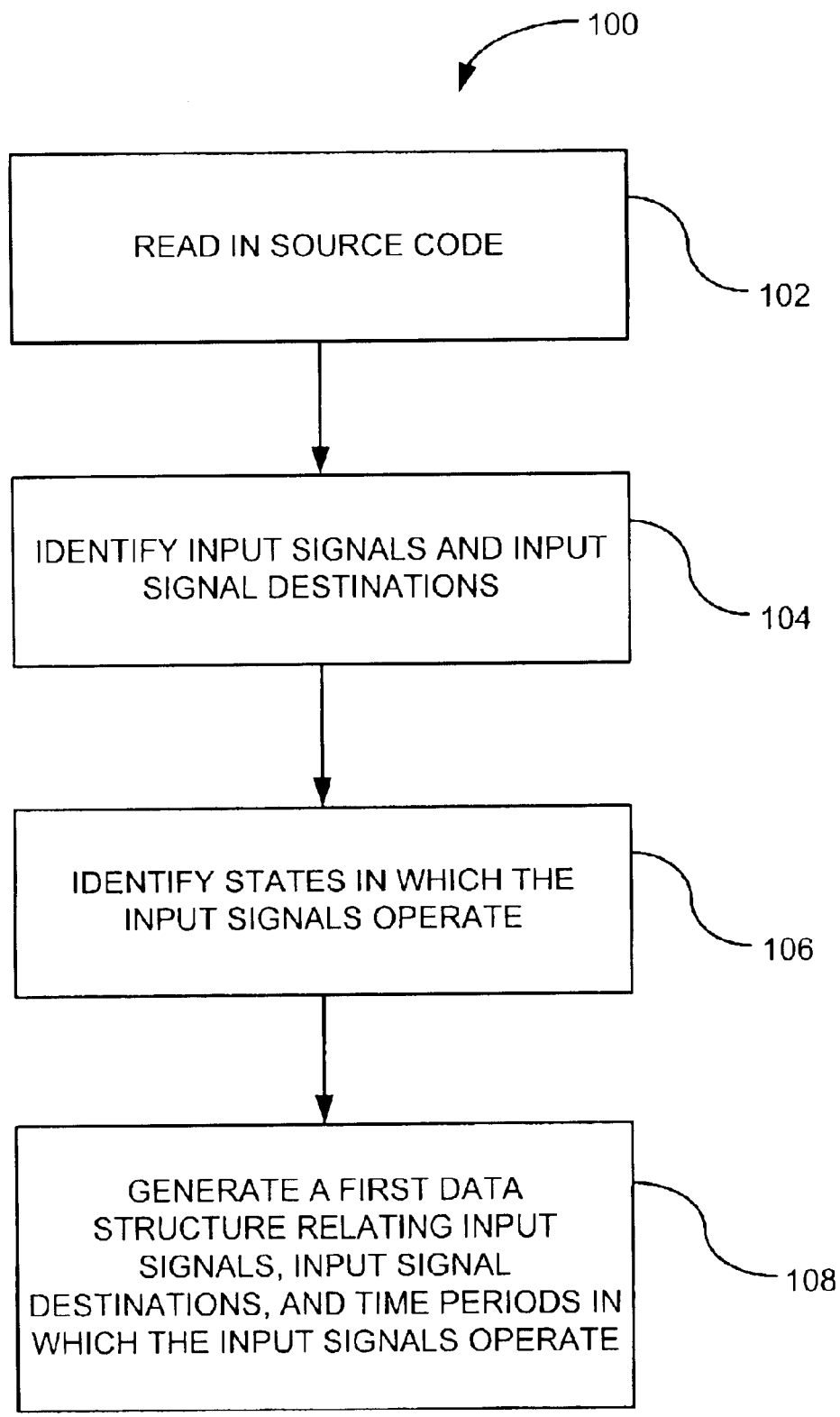
FIG. 8 is a flowchart showing the process of generating a first data structure identifying the time periods in which input signals are used.

FIG. 8 is a flowchart 100 showing in greater detail the process of creating a first data structure that relates input signals, input signal destinations, and the time periods in which the input signals operate (process block 92 of FIG. 7). In process block 102, source code is read in. The source code may be in a hardware description language, such as Verilog. In process block 104, input signals and their vector domain destinations are identified from the source code. In process block 106, the time periods in which the input signals operate are identified from the source code. In process block 108, a data structure is generating relating the input signals, their respective destinations, and the time periods in which the input signals operate. Two exemplary first data structures are described below with respect to FIGS. 13 and 14.

Figure 9:
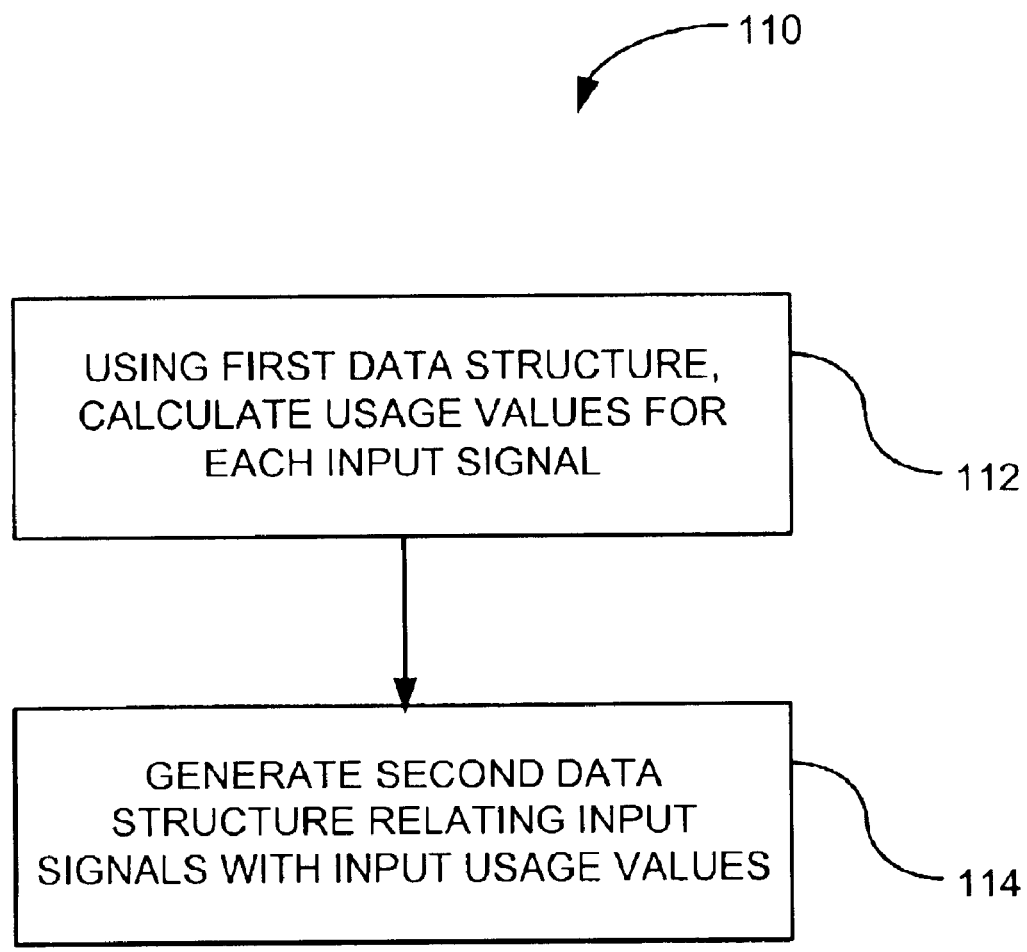
FIG. 9 is a flowchart showing the process of generating a second data structure identifying usage values for the input signals.

FIG. 9 is a flowchart 110 showing the process of creating a second data structure relating input signals with usage values (process block 94 in FIG. 7). In process block 112, usage values are calculated for each input signal identified in the first data structure. The usage values may be a function of the time periods (or states) in which an input signal operates. For instance, given an initial usage value of "0," the usage value may be increased by $2^s$ for each state s in which the input signal operates. Thus, if an input signal operates in states 1 and 3, the usage value will be 10 (i.e., $2^1+2^3=10$). The usage value may then be used to identify the states in which any given input signal operates. For instance, if an input signal has a usage value of 10, then it can be determined that the input signal operates in states 1 and 3. In process block 114, a second data structure relating the input signals with their corresponding usage values is generated. An exemplary second data structure is described below with respect to FIG. 15.

Figure 10:
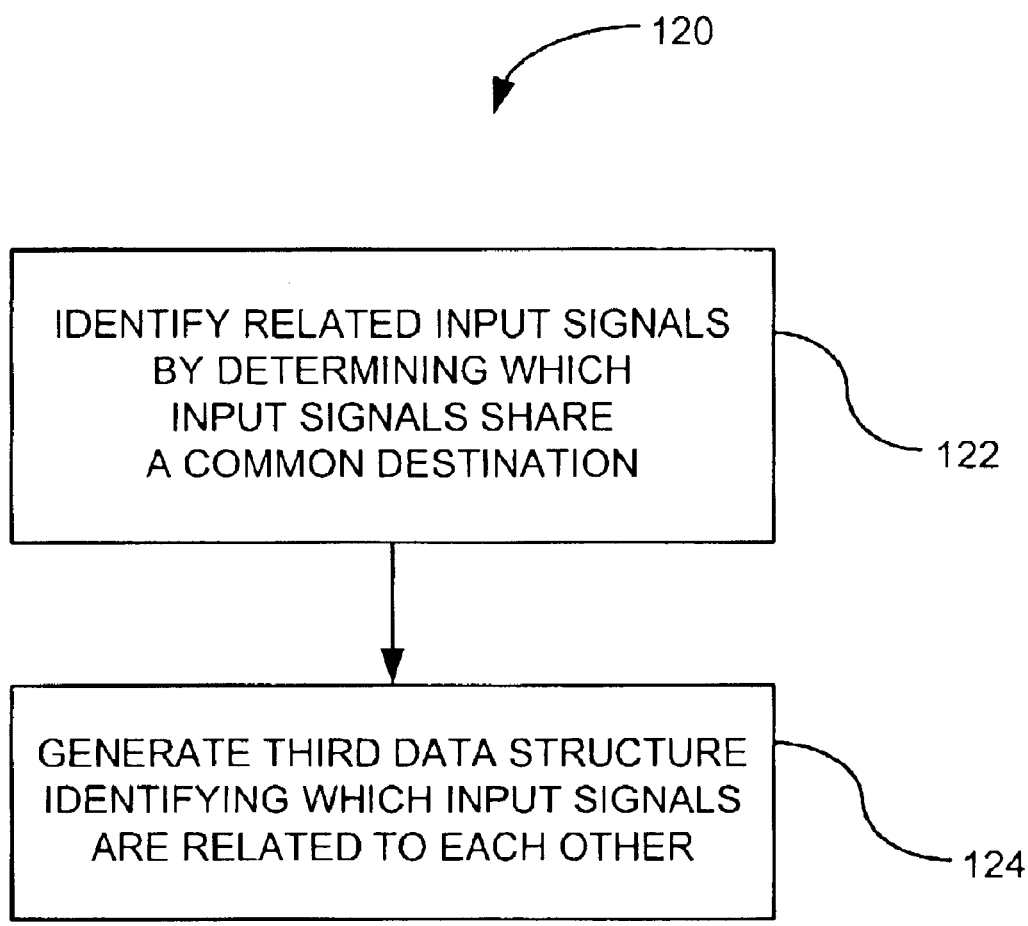
FIG. 10 is a flowchart showing the process of generating a third data structure identifying related input signals.

FIG. 10 is a flowchart 120 showing in greater detail the process of creating a third data structure identifying related input signals (process block 96 of FIG. 7). In process block 122, input signals that are related are identified. Related input signals are those input signals that share a common destination, and should therefore be grouped together. For example, multiple input signals may be routed to the same vector-domain-engine input, and should therefore be identified as related input signals. In one embodiment, the input signals that share a common destination are identified from the respective usage values from the second data structure. In process block 124, a data structure identifying the related input signals is created. The data structure may also identify how many times the groups of related input signals share a common destination. An exemplary third data structure is described below with respect to FIG. 16.

Figure 11:
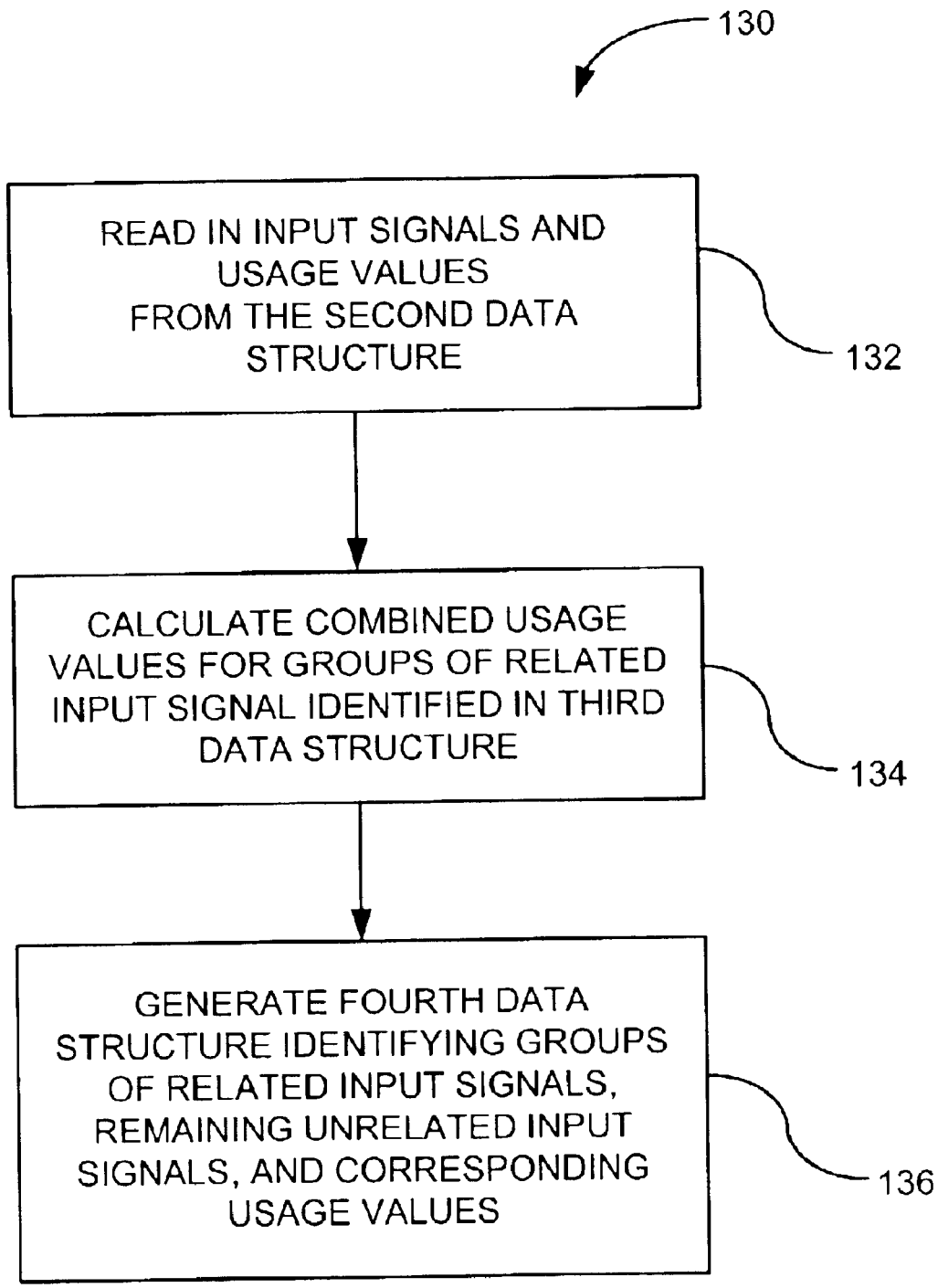
FIG. 11 is a flowchart showing the process of generating a fourth data structure identifying the related inputs signals, the remaining unrelated input signals, and their associated usage values.

FIG. 11 is a flowchart 130 showing the process of creating a fourth data structure that combines information from the second and third data structures and that is used to identify which input signals may be further grouped together (process block 98 of FIG. 7). In process block 132, the usage values relating to each input signal are read in from the second data structure, described above in relation to FIG. 9. In process block 134, a combined usage value is calculated for each group of related input signals listed in the third data structure. The combined usage value corresponds to the sum of the usage values for each input signal in a group of related input signals and may he used to identify the time periods in which the related input signals operate. For example, if input signal c has a usage value of 6 and an input signal e has a usage value of 24, then the combined usage value for group [c, e] is 30 (i.e., 6+24). In process block 136, a data structure is generated that identifies the groups of related inputs signals from the third data structure and their corresponding combined usage values calculated at process block 134. The remaining unrelated input signals and their usage values may also be transferred to the fourth data structure from the second data structure, discussed above with respect to FIG. 9. Accordingly, the fourth data structure identifies the groups of related input signals with their corresponding combined usage values and the remaining unrelated input signals with their corresponding usage values.

In one embodiment, an additional determination is made for each group transferred from the third data structure to the fourth data structure as to whether that group may be combined with any of the other groups in the third data structure. This determination may be made by analyzing the combined usage values of the groups under consideration to determine whether the input signals of the groups operate in mutually exclusive time periods. If it is determined that the groups under consideration may be combined because their inputs signals operate in mutually exclusive time periods, then the groups may be combined into a single combined group and a new combined usage value calculated. The combined group and new combined usage value may then be entered into the fourth data structure.

Figure 12:
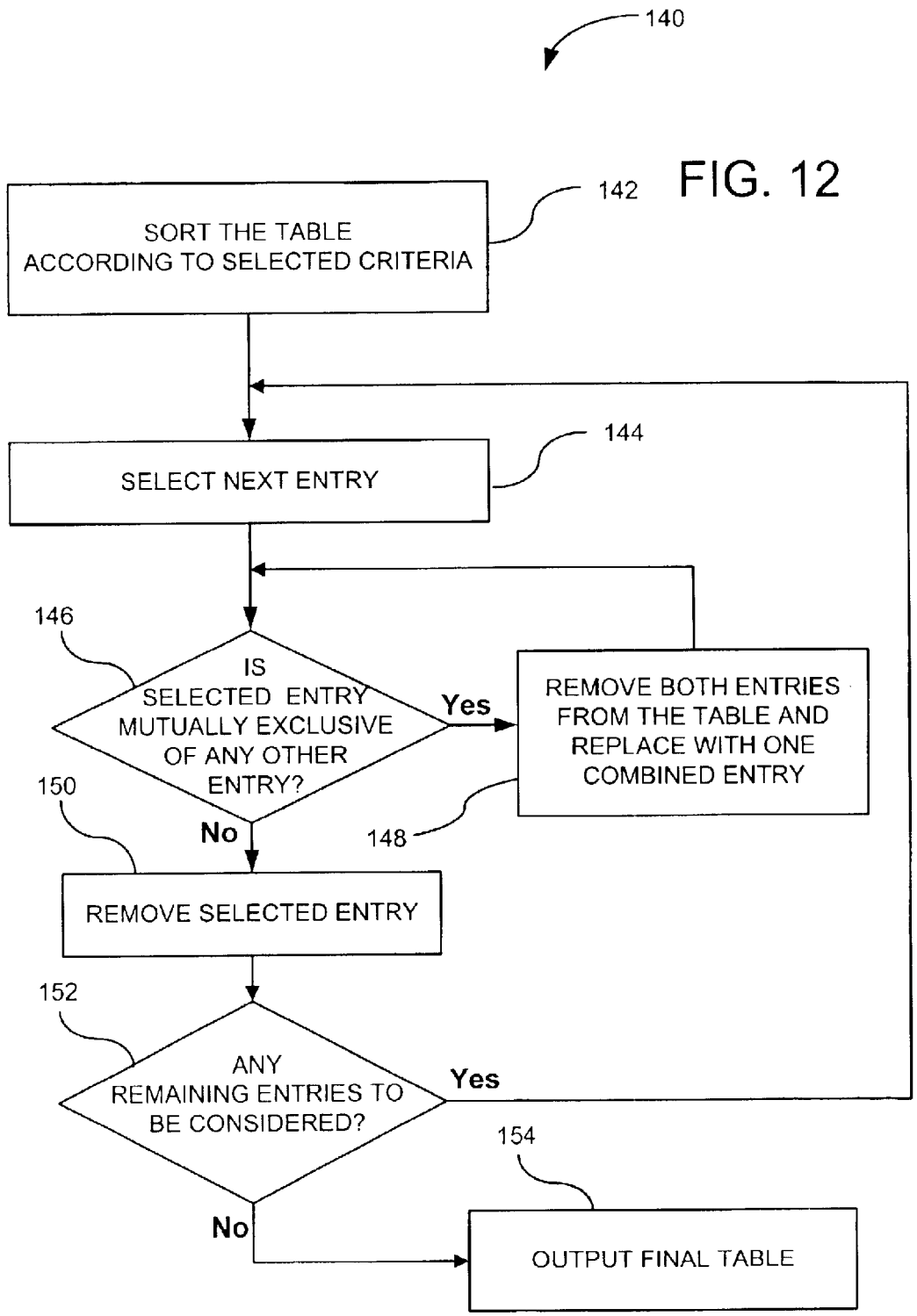
FIG. 12 is a flowchart showing the process of iteratively compressing the fourth data structure.

FIG. 12 is a flowchart 140 showing the process of iteratively compressing the fourth data structure in order to determine whether additional groupings of input signals are possible (process block 99 of FIG. 7). In process block 142, the entries of the fourth data structure may be sorted according to a selected criteria (e.g. the usage values of the entries, the number of input signals in an entry, the total number of time periods in which the input signals of an entry operate, whether the input signals of an entry operate in particular time periods, etc.). Alternatively, the entries may not be sorted at all. In process block 144, the next entry of the fourth data structure is selected. In process block 146, a determination is made as to whether the selected entry may be grouped with any other entries of the fourth data structure. This determination can be made by analyzing the usage values of the entries under consideration to determine whether the selected entry and the successive entries in the data structure operate in mutually exclusive time periods. If the entries under consideration can be grouped together because they operate in mutually exclusive time periods, then, at process block 148, the entries are removed from the fourth data structure and replaced with a new single entry that combines the input signals of the previous entries. The new entry is then considered at process block 146 for grouping with the other remaining entries. If process block 146 determines that none of the entries can be grouped with the selected entry, then, at process block 150, the selected entry is removed from the fourth data structure. The removed entry may then be included in a final data structure containing the final groupings. This iterative process continues until a determination is made at process block 152 that there are no more entries in the fourth data structure to be considered. If no more entries are to be considered, the final data structure is output at process block 154.

The final data structure provides information sufficient to build an input switching unit that may comprise at least one multiplexer. The input switching unit is not limited to multiplexers, however, and may be composed of other logic units. As discussed above in relation to FIG. 6, control signals may be used to control which input signals are routed through interface 18 during which time periods.

Figure 13:
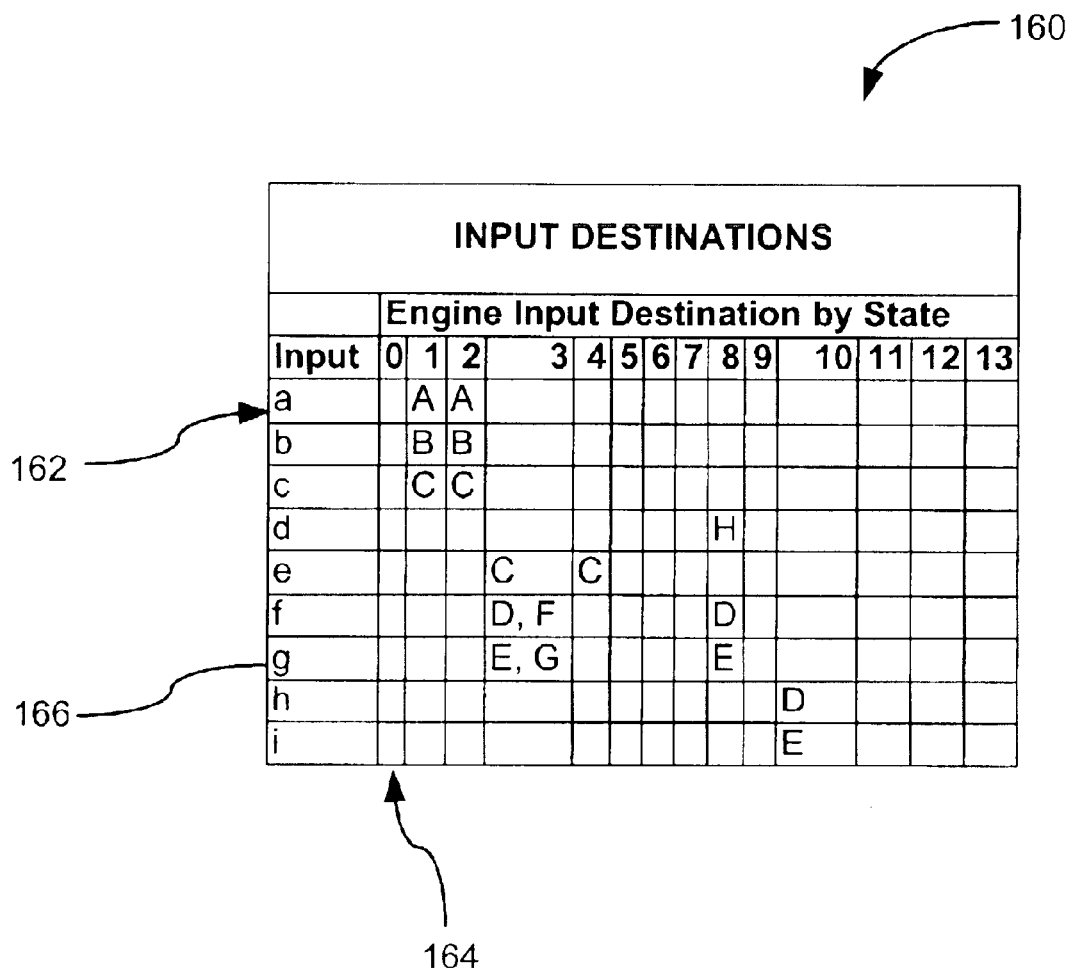
FIG. 13 shows an exemplary first data structure identifying the time periods in which the input signals operate.

FIGS. 13–23 show one particular implementation of the disclosed method. FIG. 13 is an exemplary first data structure as may be generated by method 100 shown in FIG. 8. In FIG. 13, the first data structure is a table 160 termed the "input destinations" table. In the illustrated embodiment, input destinations table 160 has multiple rows, shown generally at 162, that contain information for each input signal that is to be routed to vector domain 14 through interface 18. As illustrated, the input signals are designated by lower-case letters a through i, but it is understood that any number of input signals may be used. Table 160 also includes multiple columns, shown generally at 164, that correspond to the various states in which PLD 10 operates. If a particular input signal operates in a particular state, then the corresponding input signal/state cell of table 160 is populated with an upper-case letter corresponding to the destination of the input signal in that state. In the illustrated embodiment, the upper-case letters correspond to the inputs of a vector-domain engine to which the input signals are routed during particular states. For example, as is shown in row 166, input signal g is routed to vector-domain-engine inputs E and G during state 3 and to input E during state 8. In all other states, input signal g is not routed to the vector domain. It is understood that various other schemes and methods of representing this information are possible. For instance, the cell entry does not need to specifically identify the destination of the input signal or may identify the destination using various other symbols or letters.

FIG. 14 is an exemplary alternative first data structure as may be generated by method 100 shown in FIG. 8. In FIG. 14, the first data structure is a table termed the "engine inputs" table. The data contained in the engine inputs table is similar to that contained in the input destinations table but is presented in a different form. In the illustrated embodiment, engine inputs table 170 has multiple rows, shown generally at 172, that contain information for each vector-domain-engine input to which the input signals are routed. Table 170 also includes multiple columns, shown generally at 174, that correspond to the various states in which PLD 10 operates. If a particular vector-domain-engine input receives an input signal in a particular state, then the corresponding engine/state cell is populated with a lower case letter identifying the particular input signal. It is understood that various other schemes and methods of representing this information are possible. For instance, table 170 might identify input signal destinations other than vector-domain-engine inputs in the multiple rows. Additionally, the cell entry may identify the input signal using various other symbols or letters. Thus, the first data structure associates the input signals with destinations and identifies the states during which the input signals are routed to the destinations.

Figure 15:
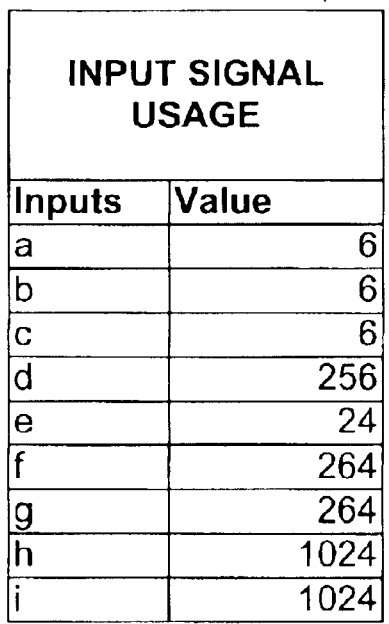
FIG. 15 shows an exemplary second data structure identifying usage values for the input signals.

FIG. 15 is an exemplary second data structure as may be generated by method 110 in FIG. 9. In FIG. 15, the second data structure is a table 180 termed the "input signal usage" table. Input signal usage table 180 has two columns, shown generally at 182 and 184 respectively. Column 182 identifies the various input signals that are routed to the vector domain through interface 18, and column 184 shows the usage value for each input signal. The usage value of an input signal may be a function of the states in which the input signal operates. In the illustrated embodiment, for instance, the usage value for each input signal is initially assigned a value of "0". A value of $2^s$ is then added to the usage value for each state in which the input signal operates, where s is equal to the value of the current state under consideration. For example, as shown in the input destinations table of FIG. 13, input signal a operates in states 1 and 2. Thus, the usage value for input signal a is 6 (i.e., $2^1+2^2=6$). Similarly, input signal operates in states 3 and 8, and thus has a usage value of 264 (i.e., $2^3+2^8=264$). The usage value may then be used to identify the states in which a particular input signal operates. It is understood, however, that other methods of calculating usage values may be utilized.

Figure 16:
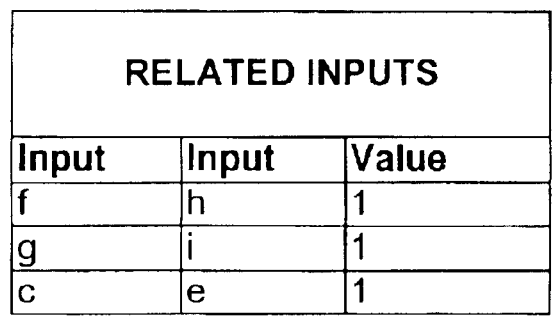
FIG. 16 shows an exemplary third data structure identifying related input signals.

FIG. 16 is an exemplary third, data structure as may be generated by method 120 in FIG. 10. In FIG. 16, the third data structure is a table 190 termed the "related inputs" table. Related inputs table 190 has multiple columns 192 and 194 that list the input signals that share a common destination, and thus form a group of related input signals. The illustrated table 190 shows only two columns of input signals because, in this particular example, no more than two input signals share a common destination. Additional columns may be shown, however, if additional input signals share a common destination. Column 196 shows a value associated with each group of related inputs. In the illustrated table 190, the value corresponds to the number of times the group of input signals is related (i.e., the number of times the group of input signals share a common destination). For instance, as shown in row 198, input signals f and h have a related inputs value of 1, indicating that they share a common destination once. Specifically, as can be seen in the input destinations table of FIG. 13, input signals f and h are both routed to vector-domain-engine input D during different states.

FIG. 17 is an exemplary fourth data structure as may be generated by method 130 in FIG. 11. In FIG. 17, the fourth data structure is a table 200 termed the "initial grouped signals" table. Initial grouped signals table 200 has two columns 202 and 204. Column 202 shows the groups of related input signals from the related input signals table and the remaining unrelated input signals from the input signal usage table. Column 204 shows the usage values associated with the corresponding entry in column 202.

FIG. 18 is an exemplary data structure 210 showing the results of a first iteration performed on the initial grouped signals table. The data structure 210 and the other data structures described below are used for illustration purposes only and need not be produced during the actual implementation of the disclosed method. In FIG. 18, data structure 210 has a "signals under consideration" entry 212 showing the signals under consideration. Multiple "sorted signals" entries, shown generally at 214, show the signals to be compared with the signals-under-consideration entry in order to determine whether the entries have input signals that are mutually exclusive of one another. In the illustrated data structure 210, the entries 214 have been sorted first according to the number of signals per entry, then by usage value. It is understood that various other criteria may be used to determine the order of the initial grouped signals table (e.g., the number of states in which the input signals of an entry operate, whether the input signals of an entry operate in a certain selected state, etc.). These criteria may depend, among other things, on the particular PLD being routed. A "result" entry 216 displays the results of the iteration and indicates the first sorted signals entry 214 found that is mutually exclusive of the signals-under-consideration entry 212. In the illustrated case, the first entry from the sorted signals entries 214 that is mutually exclusive with the signals-under-consideration entry 212 is input signal a.

FIG. 19 is an exemplary data structure 220 showing the second iteration. Data structure 220 has a signals-under-consideration entry 222 of [f, h, a], which corresponds to the combination of the signals-under-consideration entry 212 and the result entry 216 from the first iteration. In the second iteration, none of the sorted signals entries have input signals that are mutually exclusive with [f, h, a]. Thus, a result of "none" is shown at 226. The signals-under-consideration entry 222 is then removed and transferred to the final data structure shown in FIG. 23.

FIG. 20 is an exemplary data structure 230 showing the third iteration. Data structure 230 has a signals-under-consideration entry 232 corresponding to the next sorted signals entry. In this case, the next entry is [g, i]. The iteration proceeds as described above with respect to the first iteration. As is shown at 236, input signal b is found to operate in mutually exclusive states with [g, i].

FIG. 21 is an exemplary data structure 240 showing the fourth iteration. Data structure 240 has a signals-under-consideration entry 242 of [g, i, b], which corresponds to the combined result from the third iteration. In this iteration, no additional sorted signals entries are found to be mutually exclusive with entry 242. Therefore, entry 242 is removed from the data structure and transferred to the final data structure.

FIG. 22 is an exemplary data structure 250 showing the fifth iteration. Data structure 250 has a signals-under-consideration entry 252 corresponding to the next of the sorted signals entries. In this case, the next entry is [c, e]. As is shown at 256, entry [c,e] is mutually exclusive with input signal d. Because no further sorted signals entries remain to be considered, the entries are combined and transferred to the final data structure.

Figure 23:
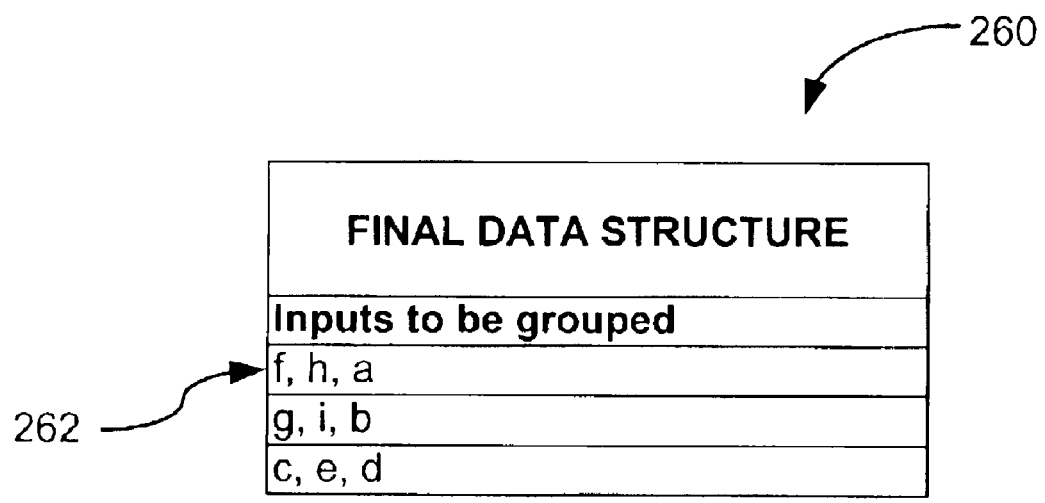
FIG. 23 shows an exemplary final data structure showing the groupings of input signals determined by the disclosed method.

FIG. 23 is an exemplary final data structure showing the results of the disclosed method. In FIG. 23, the final data structure is a table 260 having multiple entries, shown generally at 262. The entries 262 list the input signals that may be grouped together in an input switching unit as determined by the method disclosed above. In this case, for example, input signals [f, h, a] can be routed to the inputs of an input switching unit having a single output path that is routed to a conductor of the interface. The input switching unit may then be controlled so that state-based optimization of data transfer between the PLD domain and the vector domain can be achieved.

Having illustrated and described the principles of the illustrated embodiments, it will be apparent to those skilled in the art that the embodiments can be modified in arrangement and detail without departing from such principles. For instance, the present invention may be applied to volatile memory devices.

In view of the many possible embodiments, it will be recognized that the illustrated embodiments include only examples and should not be taken as a limitation on the scope of the invention. Rather, the invention is defined by the following claims. I therefore claim as the invention all such embodiments that come within the scope of these claims.

I claim:

1. A method of routing signals in a programmable logic device (PLD), comprising:
    associating usage of a plurality of input signals with time periods; and
    grouping at least a portion of the plurality of input signals together such that a group represents two or more input signals that share a conductor but that use the conductor during mutually exclusive time periods.

2. The method of claim 1, further comprising:
    routing the group of input signals to a multiplexer, and
    controlling the multiplexer to switch the input signals onto the conductor during the time periods.

3. The method of claim 1, wherein the time periods represent multiple states in which the PLD operates, the states being controlled by a state machine.

4. The method of claim 1, wherein the input signals are routed from a PLD domain to a vector domain.

5. The method of claim 1, wherein associating comprises:
    reading in a source code description of functions to be performed in the PLD; and
    identifying usage of the plurality of input signals and the time periods associated with each of the input signals from the source code description.

6. The method of claim 1, wherein associating comprises generating a data structure, the data structure identifying the time periods in which the input signals are used.

7. The method of claim 6, wherein the data structure further identifies destinations of the input signals.

8. The method of claim 1, further comprising generating a data structure, the data structure identifying usage values for the input signals.

9. The method of claim 1, further comprising generating a data structure, the data structure identifying related input signals.

10. The method of claim 1, further comprising generating a data structure, the data structure comprising data entries that identify related inputs signals and unrelated input signals, the entries further identifying combined usage values for the corresponding related input signals and usage values for the corresponding unrelated input signals.

11. The method of claim 10, further comprising iteratively compressing the data structure by grouping together data entries of input signals used in mutually exclusive time periods.

12. A machine-readable medium having stored thereon executable instructions that perform the method of claim 1.

13. A method of routing signals in a programmable logic device (PLD), comprising:
    associating a plurality of input signals with respective destinations;
    identifying two or more selected input signals that are routed to a selected destination; and
    grouping the selected input signals together into a group, the group representing two or more input signals that are routed to the selected destination and that share a conductor.

14. The method of claim 13, further comprising:
    routing the group of input signals to a multiplexer; and
    controlling the multiplexer to switch the input signals of the group onto the conductor during mutually exclusive time periods.

15. The method of claim 13, further comprising associating usage of the plurality of input signals with time periods, and wherein grouping is performed for input signals that use the conductor during mutually exclusive time periods.

16. The method of claim 13, wherein the input signals are routed from a PID domain to a vector domain.

17. A method of routing signals in a programmable logic device (PLD), comprising:
    calculating usage values for a plurality of input signals, the usage values identifying the time periods in which the input signals operate; and
    analyzing whether two or more of the input signals can be grouped together to share a conductor based on the calculated usage values.

18. The method of claim 17, wherein a usage value of one of the plurality of input signals is calculated by increasing the usage value by $2^s$ for each state s in which the input signal operates.

19. The method of claim 17, wherein the input signals are routed from a PLD domain to a vector domain.

20. A programmable logic device, comprising:
    multiple programmable logic cells having multiple outputs;
    a vector domain component having an input; and
    an input switching unit coupled between the programmable logic cells and the vector domain component, wherein the input switching unit is operable to route different input signals to the vector domain component based on a state of the PLD, and wherein the input switching unit comprises a multiplexer.

21. The device of claim 20, further comprising:
    an interface comprising multiple conductors, the conductors having an associated input and an output, a selected conductor having an output coupled to the input of the vector domain component.

22. The device of claim 20, wherein the vector domain component is an embedded processor configured to perform dedicated functions on vectors.

23. A system for routing signals within a programmable logic device (PLD), comprising:
    means for associating a plurality of input signals with time periods, the input signals being transmitted from a PLD domain to a vector domain; and
    means for organizing the plurality of input signals into at least one group, the group comprising input signals that share a conductor but that use the conductor during mutually exclusive time periods.

24. The system of claim 23, further comprising:
    means for routing the group of input signals to a multiplexer; and
    means for controlling the multiplexer to switch the input signals onto the conductor during the mutually exclusive time periods.

25. The system of claim 23, further comprising means for generating a data structure, the data structure identifying the time periods in which the input signals are used.

26. The system of claim 23, further comprising means for generating a data structure, the data structure identifying usage values for the input signals.

27. The system of claim 23, further comprising means for generating a data structure, the data structure identifying related input signals.

28. The system of claim 23, further comprising means for generating a data structure, the data structure comprising data entries that identify related inputs signals and unrelated input signals, the entries further identifying combined usage values for the corresponding related input signals and usage values for the corresponding unrelated input signals.

29. The system of claim 28, further comprising means to iteratively compress the data structure by grouping together data entries that identify input signals used in mutually exclusive time periods.

* * * * *

UNITED STATES PATENT AND TRADEMARK OFFICE
CERTIFICATE OF CORRECTION

PATENT NO. : 6,809,551 B1
DATED : October 26, 2004
INVENTOR(S) : David J. Wicker Jr.

It is certified that error appears in the above-identified patent and that said Letters Patent is hereby corrected as shown below:

Column 14,
Line 2, "PID" should be -- PLD --.
Line 12, "$2^5$" should be -- $2^S$ --.

Signed and Sealed this

Seventeenth Day of May, 2005

JON W. DUDAS
*Director of the United States Patent and Trademark Office*